United States Patent [19]

Murray et al.

[11] Patent Number: 5,162,193
[45] Date of Patent: Nov. 10, 1992

[54] RADIATION SENSITIVE DEVICES

[75] Inventors: David E. Murray; Andrew E. Matthews, both of Leeds, United Kingdom

[73] Assignee: Du Pont-Howson Limited, Leeds, United Kingdom

[21] Appl. No.: 615,226

[22] Filed: Nov. 19, 1990

[30] Foreign Application Priority Data

Nov. 21, 1989 [GB] United Kingdom ............... 8926281

[51] Int. Cl.⁵ .......................... G03F 7/11; G03F 7/16
[52] U.S. Cl. ................................. 430/273; 430/271; 430/935; 430/166; 430/162; 430/961
[58] Field of Search .............. 430/273, 271, 935, 166, 430/162, 961

[56] References Cited

U.S. PATENT DOCUMENTS 2,695,002 11/1954 Miller ................................. 118/51
4,626,484 12/1986 Nishioka et al. ................. 430/273
4,842,982 6/1989 Seibel et al. ................. 430/273 X
5,006,442 4/1991 Cooper et al. ................. 430/273 X

FOREIGN PATENT DOCUMENTS 0132063 1/1985 European Pat. Off.
0216502 4/1987 European Pat. Off.
0243031 10/1987 European Pat. Off.
2118862 11/1983 United Kingdom.

Primary Examiner—Cynthia Hamilton
Attorney, Agent, or Firm—Harness, Dickey & Pierce

[57] ABSTRACT

A radiation sensitive device is provided with a discontinuous covering layer to improve vacuum draw down. The covering layer is produced by forming a solution or dispersion of the layer-forming material in a liquid hydrocarbon. Drops of the solution or dispersion are then sprayed onto the radiation sensitive device to form the discontinuous covering layer.

10 Claims, 3 Drawing Sheets

RADIATION SENSITIVE DEVICES

BACKGROUND OF THE INVENTION

This invention relates to radiation sensitive devices and more particularly, but not exclusively, is concerned with radiation sensitive plates for the production of lithographic printing plates.

Such radiation sensitive devices are known and comprise a substrate, e.g. a metallic sheet, coated with a radiation sensitive layer. In use of such devices in lithographic printing plate production, the radiation sensitive layer is exposed to radiation using a transparency so that parts of the layer are struck by the radiation and other parts are not. In the case of negative-working radiation sensitive layers, the radiation struck areas become less soluble than the non-radiation struck areas. In the case of positive-working radiation sensitive layers, the radiation struck areas become more soluble than the non-radiation struck areas. Thus, by treating the image-wise exposed layer with a developer liquid for the more soluble areas, these areas can be selectively removed from the substrate to form an image constituted by the less soluble areas. This image constitutes the printing image of the eventual printing plate and the non-printing areas of the plate are constituted by the surface of the substrate revealed on development.

The printing image and the non-printing areas are essentially co-planar and the lithographic printing process depends upon the differing affinities of the printing image and the non-printing areas for ink and water. The printing image is ink-receptive and water-repellant and the non-printing areas are water-receptive and ink-repellant. During printing, water is applied to the plate and is received by the non-printing areas and repelled by the printing image. Then, ink is applied and this is repelled by the wet non-printing areas and received by the printing image. The ink is then transferred from the printing image onto the paper or the like to be printed.

When image-wise exposing a radiation-sensitive plate in the production of a lithographic printing plate it is essential that there is good contact between the transparency through which the plate is to be exposed and the radiation sensitive layer of the plate itself. The contact is achieved by using a printing down frame in which the plate and transparency are positioned between a flexible backing member and a glass sheet. The air between the backing member and the glass sheet is evacuated causing the plate and transparency to be squeezed together. This process is conventionally referred to as vacuum drawdown.

However, it is possible for pockets of air to be trapped between the smooth surface of the radiation sensitive layer of the plate and the transparency preventing, or at least extending the time required to achieve, the necessary contact. To overcome this problem, the radiation sensitive layer may be given a roughened surface which provides channels through which such air pockets can be evacuated.

There have been many suggestions as to how the roughened surface may be provided and in this regard reference may be made to UK Patent Specifications No. 1495361, No. 1512080, No. 2046461, and No. 2075702 and European Patent Specification No. 21428.

Japanese Patent Specification No. 98505/76 discloses spraying a waxy or fine-powdered resin from a solvent liquid onto the surface of the radiation sensitive layer so as to leave sprayed particles on the surface.

UK Patent Specification No. 2043285 discloses spraying the radiation sensitive layer with a powder and UK Patent Specification No. 2081919 discloses spraying the radiation sensitive layer with a watersoluble resin from an aqueous solution.

Whilst these suggestions all improve the vacuum drawdown they have certain disadvantages such as lack of adhesion of the sprayed particles to the radiation sensitive layer or incompatibility of the sprayed material with the radiation sensitive layer or with the developer liquids commonly used to develop the radiation sensitive layer after image-wise exposure.

To overcome these disadvantages, European Patent Specification No. 174588 discloses providing the surface of the radiation sensitive layer with a covering layer having the same composition as the radiation sensitive layer by spraying the radiation sensitive layer with a solution containing the same components as the radiation sensitive layer. Whilst this approach gives an improvement it still has certain disadvantages which are detailed in WO 87/03706 wherein the radiation sensitive layer is sprayed with a discontinuous covering layer which is more light sensitive than the radiation sensitive layer.

According to the present invention, there is provided a method of producing a radiation sensitive device which comprises
 (i) providing a substrate carrying a radiation sensitive layer,
 (ii) providing a solution or dispersion, in a liquid hydrocarbon, of a material which is soluble or dispersible in developer for the radiation sensitive layer, and
 (iii) directing said solution or dispersion towards the radiation sensitive layer by a spraying technique to form a discontinuous covering layer of the material on the surface of the radiation sensitive layer.

The solution or dispersion may be applied by a conventional spraying technique wherein the liquid is disrupted into drops (atomised) by means of mechanical forces. These can be turbulent air, mechanical shear (rotating disc/bell) or expansion of the liquid as it is pumped at high pressure through a small orifice (airless spraying). Conventional electrostatic spraying, which also uses one of these methods to atomise the liquid to be sprayed can be used. In this case the atomised droplets produced are electrostatically charged to attract them to the grounded substrate in order to improve deposition efficiency.

An alternative technique which can be used is the electrostatic atomisation technique described in our EP-A-0344985. In this technique, the solution or dispersion preferably has a conductivity of from $10^3$ to $10^9$ pSm$^{-1}$ and a potential of at least 5 kV relative to the substrate is directly or indirectly induced in the solution or dispersion so that it forms drops in the absence of any other disruptive forces acting on it. This has the advantage that drops of more uniform size are produced.

In use of this electrostatic atomisation technique, the liquid is drawn out into one or more ligaments which break up into substantially equal sized drops which are attracted to the surface of the radiation sensitive layer due to the potential difference. Because the drops are of substantially the same size, the evaporation of the hydrocarbon liquid can be controlled so that all the drops reach the surface of the radiation sensitive layer at a similar degree of wetness. Preferably, the potential applied or induced is from 5 (preferably 10) to 35 kV of either polarity relative to the substrate. Too low a potential for a given liquid feed rate can give insufficient force to properly atomise the liquid giving a wide variety of drop sizes. Too high a potential can cause corona discharge from the tips of the ligaments which also gives a wide variety of drop sizes. Typically, the liquid feed rate may be from 0.05 to 2.0 cm$^3$ per min per ligament. The size of the drops produced can be varied by adjusting the parameters: liquid feed rate, liquid conductivity or potential applied Reducing the liquid flow, increasing the liquid conductivity or increasing the potential applied all reduce the drop size. Larger changes in drop size can be achieved by varying two or more of the parameters simultaneously.

Generally, the liquid hydrocarbon used in accordance with the present invention will have a boiling point of from about 150° to 200° C. Typically, the hydrocarbon has from 6 to 11 carbon atoms and examples of suitable hydrocarbons are aliphatic hydrocarbons such as those commercially available under the trade designations Isopar (Exxon Chemicals Ltd) and Shellsol T (Shell Chemicals Ltd) and aliphatic/aromatic hydrocarbon mixtures such as White Spirit 100 (Exxon).

The material of the discontinuous covering layer may or may not be radiation sensitive.

The nature of the material for the discontinuous layer is determined by:

i) whether the material is to be sprayed as a solution or as a dispersion, ii) the nature of the radiation sensitive layer onto whose surface the discontinuous layer is to be applied, and iii) the composition of the developer to be used for the radiation sensitive layer If the radiation-sensitive coating is, for example, a naphthoquinone diazide sensitised cresol novolak resin which after exposure is developed using a dilute aqueous alkaline solution, the material of the discontinuous covering layer will ideally also be soluble or dispersible in the same dilute aqueous alkaline solution. The use of an organic solvent or mixture of solvents as developer would similarly and ideally require the use of a material for the discontinuous layer which is also soluble or dispersible in the same solvent or solvent mixture.

There is also a need for the material employed for the discontinuous covering layer to be relatively transparent to the region of the spectrum to which the underlying radiation sensitive layer is to be exposed. It also needs to be sufficiently tough to provide an adequately abrasion resistant discontinuous layer.

The material for the discontinuous layer can be applied in solution but is preferably applied as a dispersion in the hydrocarbon solvent. If a solution is employed then suitable materials for the discontinuous covering layer are, for example, Plioway EC, a vinyl acetate terpolymer supplied by the Goodyear Tire and Rubber Company, and a copolymer of a $C_4$–$C_{10}$ alkyl ester of methacrylic acid (70–90 mole %) and methacrylic acid (10–30 mole %). In the event of a dispersion being used, the choice of suitable materials for the discontinuous covering layer becomes very wide subject to the additional requirement that it can be used to produce a stable dispersion in a hydrocarbon liquid. If necessary non-hydrocarbon solvents may be added to assist in dispersion or dissolution.

For environmental reasons there has been a gradual moving away from the use of organic solvents in the processing of radiation sensitive plates in lithographic printing plate production. As a result the bulk of both positive and negative plates employed in the printing industry at the present time require the use of an aqueous based, usually alkaline, developer liquid. In order to ensure that the material constituting the discontinuous layer for such plates are soluble/dispersible in such aqueous based developer liquids, groups conferring water/aqueous alkali solubility need to be incorporated within its structure. Examples of such groups are —OH, —COOH, —$SO_3H$, —$PO_3H$, —$SO_2NH$— groups and their corresponding anions. Typical materials for the discontinuous covering layer are polymers prepared by copolymerizing one or more of acrylic acid, methacrylic acid, crotonic acid, itaconic acid, maleic acid and fumaric acid with one or more of styrene, vinyl toluene, ethylene, propylene, vinyl acetate, methyl methacrylate, butylmethacrylate, ethyl acrylate and acrylonitrile. Water soluble polymers such as cellulose derivatives, poly vinyl alcohol and polyacrylic acid are also suitable. Organic solvent-developable printing plates ideally require that the material of the discontinuous layer be soluble or dispersible in the same organic solvent as is in the developer liquid. Many polymer types are suitable as such a material including epoxy resins, alkyl(meth)acrylate copolymers, styrene maleic acid ester copolymers, and novolak resins.

The material of the discontinuous covering layer will generally be tacky to facilitate its adhesion to the radiation sensitive layer. This can be achieved by incorporating adhesion promoting materials or low levels of high boiling point tackifying solvents Alternatively, or additionally, the desired tackiness can be achieved as a consequence of the technique used to form the dispersion of the material.

Preparation methods for suitable dispersions are described in 'Dispersion Polymerisation in Organic Media' edited by K. E. J. Barrett. These include techniques such as dispersion polymerisation, non-aqueous aqueous emulsion polymerisation, molten polymer emulsification, resin solution emulsification, precipitation, flushing from aqueous emulsions and a variety of milling procedures. Non-aqueous polymerisation techniques are particularly useful in that they employ dispersants which cause the dispersed particles to have an intrinsic tackiness which can promote self-fixing to the surface of the underlying radiation sensitive layer. Additional adhesion promoting materials can be added as can low levels of high boiling point tackifying solvents.

The advantages of using a hydrocarbon liquid either as solvent or dispersion medium for the material forming the discontinuous layer include i) the spray liquid is unlikely to dissolve or disrupt the surface of the radiation sensitive layer, ii) the spray liquid can be applied to the surface of a wide range of radiation sensitive layers, and iii) the solution or dispersion can, because of its low conductivity, be sprayed using the technique of electrostatic atomisation disclosed in EP A-0344985.

The radiation sensitive layer on which the discontinuous covering layer is formed may be a positive-working material such as a composition comprising a novolak resin and a naphthoquinone diazide ester or a negative-working material such as a composition as described in our European Patent No. 0030 862.

BRIEF DESCRIPTION OF THE DRAWINGS

For a better understanding of the invention and to show how the same may be carried out reference will now be made, by way of example to the accompanying drawings, in which.

In the drawings, corresponding parts are denoted by like reference numerals.

DESCRIPTION OF THE PREFERRED EMBODIMENTS

Figure 1:
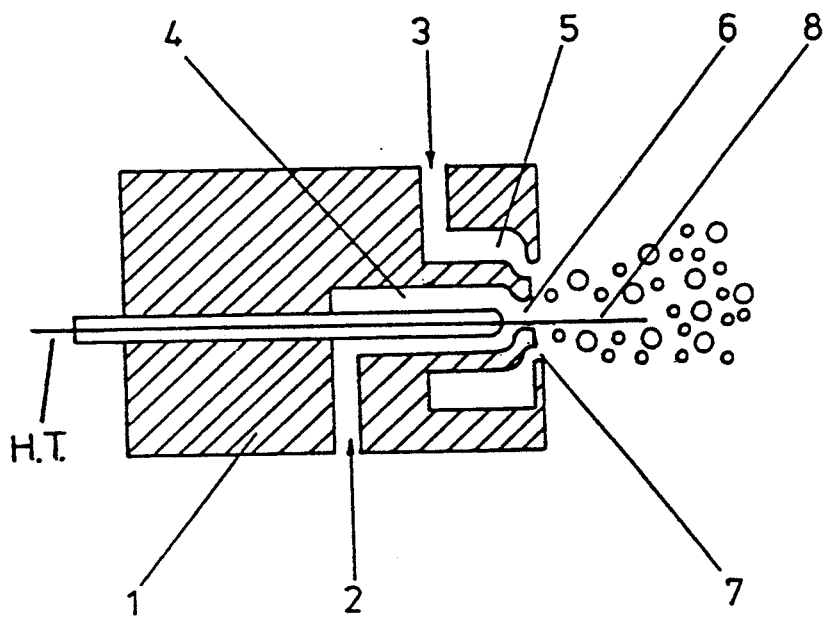
FIG. 1 is a schematic section through a first apparatus suitable for use in carrying out the method of the present invention.

Referring now to FIG. 1, the apparatus is an air assisted electrostatic spray apparatus which comprises a spray head 1 including a first inlet 2 for liquid to be sprayed and a second inlet 3 for compressed air. The inlets 2 and 3 communicate with conduits 4 and 5 respectively which terminate in concentrically arranged outlets 6 and 7 respectively. The head includes a charging needle 8 connected to a high tension (H.T.) source.

In use, liquid and compressed air are fed into the head via inlets 2 and 3 and emerge via outlets 6 and 7. The compressed air causes the formation of a turbulent air zone in the vicinity of the outlets 6 and 7 resulting in disruption of the liquid to form droplets. An electrostatic charge is induced in the liquid drops by the needle 8 and the drops are then attracted to the workpiece (not shown) to be sprayed as a consequence of electrostatic forces.

Figure 2:
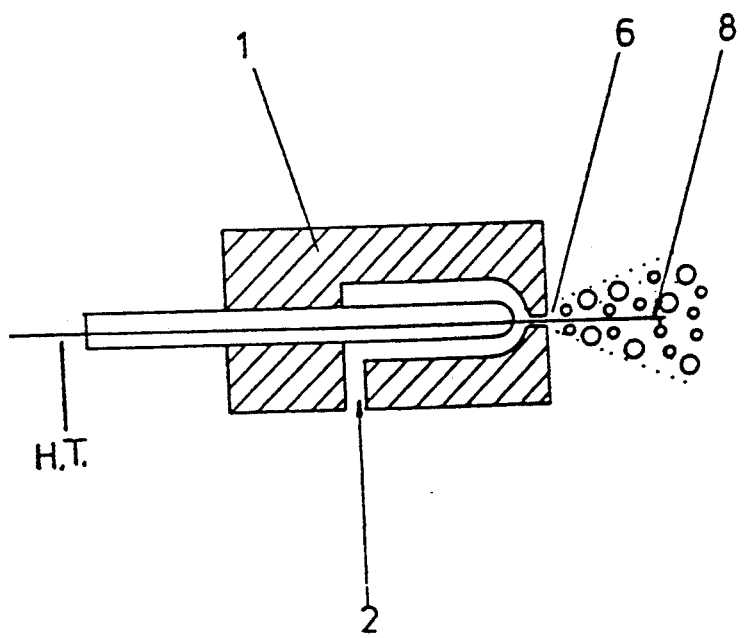
FIG. 2 is a schematic section through a second apparatus suitable for use in carrying out the method of the present invention.

The apparatus of FIG. 2 is an airless electrostatic spray apparatus. In this case, the head 1 does not include an inlet for compressed air. The liquid is introduced into inlet 2 under high pressure and the outlet 6 is small. The release of the liquid under pressure through the outlet 6 causes the liquid to be disrupted into drops. The liquid drops are then given an electrostatic charge by the needle 8 and are attracted to the workpiece as a consequence of electrostatic forces.

Figure 3:
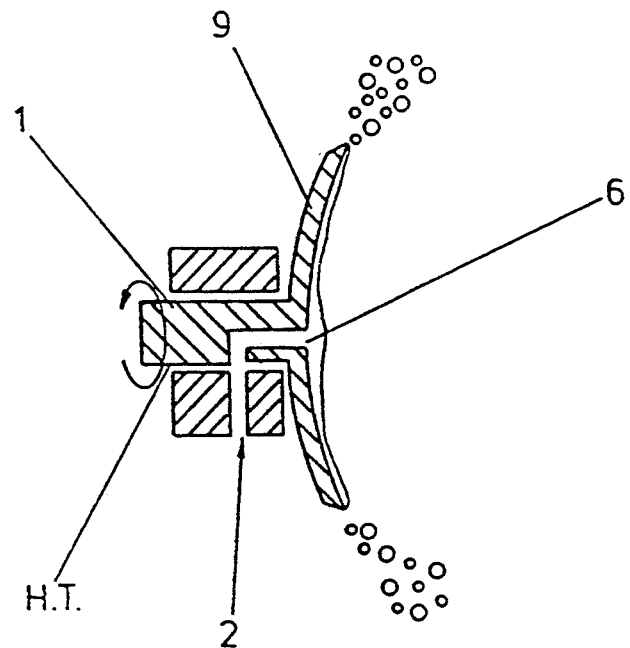
FIG. 3 is a schematic section through a third apparatus suitable for use in carrying out the method of the present invention.

The apparatus of FIG. 3 is an electrostatic rotary bell atomiser. Again the head 1 includes no inlet for compressed air. In this case, however, it is rotatably mounted and the liquid outlet 6 is located at the centre of a bell 9. The head 1 is connected to a high tension (H.T.) source and is rotated at high speed (e.g. 30000 RPM) whilst liquid is introduced at inlet 2. The liquid flows towards the edge of the bell 9 and is subjected to high shear as a consequence of the centrifugal force. This causes the liquid to be disrupted into drops which become electrostatically charged by contact with the charged bell 9 and the charged drops are then attracted to the workpiece by electrostatic forces.

Figure 4:
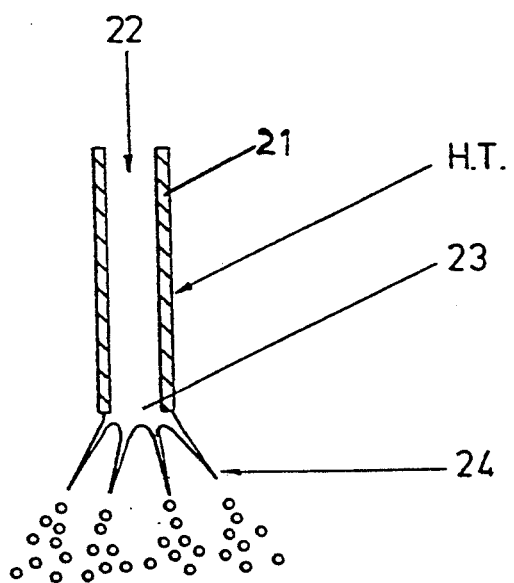
FIG. 4 is a schematic section through a fourth apparatus for use in carrying out the method of the present invention.

Referring now to FIG. 4, the apparatus comprises a single tube 21 having an inlet 22 for the liquid to be sprayed. The tube 21 is connected to a source of high tension (H.T.). In use, the liquid passes down the tube and forms a plurality of ligaments 24 located around the periphery of the outlet 23 as a consequence of the potential applied to the tube 21. These ligaments then disrupt, under the influence of the potential difference, to form a cloud of charged drops of substantially similar size which are then attracted to the substrate (not shown) by electrostatic forces.

Figure 5:
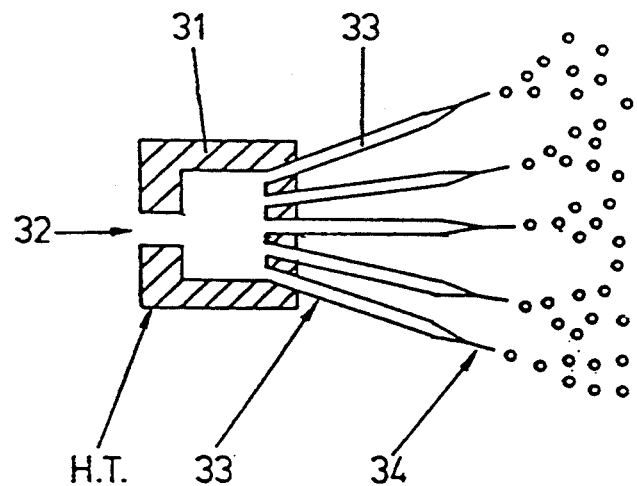
FIG. 5 is a schematic section through a fifth apparatus for use in carrying out the method of the present invention.

The apparatus of FIG. 5 comprises a head 31 including an inlet 32 for liquid and a plurality of outlet tubes in the form of capillary needles 33. The head 31 is connected to a source of high tension (H.T.) and liquid is introduced via inlet 32. The potential causes the liquid passing down the needles 33 to form ligaments 34, one at the end of each needle, which are then disrupted to form a cloud of substantially uniformly sized charged drops which are attracted to the substrate.

Figure 6:
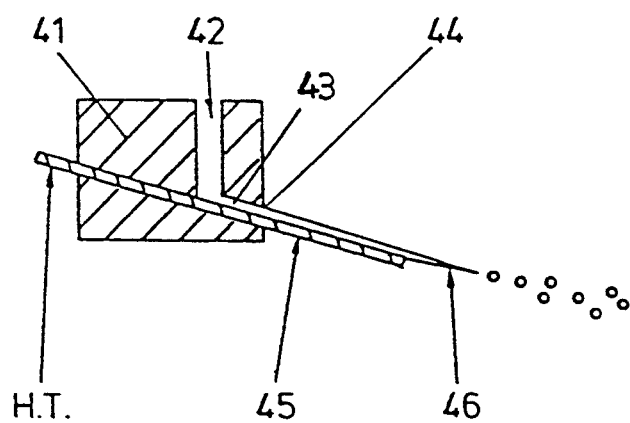
FIG. 6 is a schematic section through a sixth apparatus for use in carrying out the method of the present invention.

Referring to FIG. 6, the apparatus comprises a head 41 including an inlet 42 for liquid. The inlet 42 communicates with a conduit 43 which terminates in an outlet 44 bounded by a blade 45 connected to a source of high tension (H.T.).

In use, the liquid introduced into the head 41 flows out of outlet 44 and along blade 45. The potential applied to the blade causes the liquid to form a plurality of ligaments 46 at intervals along the blade edge. These ligaments 46 are subsequently disrupted by the potential to form a cloud of charged drops of substantially uniform size which are then attracted to the substrate.

The following Examples illustrate the invention:

EXAMPLE 1

A radiation sensitive plate was prepared by coating an aluminium substrate with a radiation sensitive composition comprising a naphthoquinone diazide ester and a cresol novolak resin.

An electrostatic atomising apparatus (as schematically shown in FIG. 4) including a capillary tube having an external diameter of 3.9 mm and an internal diameter of 2.0 mm was provided and the plate was positioned so that the radiation sensitive layer was beneath the tube. A potential of $-15$ kV was applied to the tube (with respect to the plate substrate) and the tube was fed with Dispersion A. The ambient temperature was 30 degC. and the distance between the tip of the tube and the plate was 435 mm. The total flow rate was 0.75 $cm^3$ per min and ligaments were formed at the end of the tube.

On examination, the treated plate was found to have a well adhered discontinuous overlayer made up of resin particles none of which had penetrated the radiation sensitive layer. When placed in a vacuum exposure frame, the drawdown time was found to be half that of an untreated plate.

DISPERSION A

A vinyl acetate copoly crotonic acid latex was prepared using the following formulation:

| | |
|---|---|
| Vinyl Acetate | 150 g |
| Crotonic Acid | 50 g |
| Azobisisobutyronitrile (AZBN) | 4 g |
| Isopar H | 250 $cm^3$ |
| Hexane | 100 $cm^3$ |
| Dispersant solution | 33 $cm^3$ |

All the components were mixed to form a completely clear solution. This solution was heated for 5 hours at 80°-85° C. A further 2 g of AZBN were added and heating was continued for further 5 hours. The hexane was then distilled off (removing any vinyl acetate residues) and the final dispersion had a solids content of 43% w/v.

The dispersant solution was prepared as follows:

A mixture of 103 g lauryl methacrylate, 3 g of glycidyl acrylate, 1.2 g AZBN and 15 cm$^3$ of ethyl acetate was pumped into 160 cm$^3$ of refluxing heptane over 5 hours. Heating was continued for a further 2 hours. 0.05 g hydroquinone, 1.5 g methacrylic acid and 0.2 g benzyl dimethylamine were added and refluxing was continued for a further 13 hours. The final solids content was 33% w/v.

The dispersion solids content was adjusted to 30% w/v by the addition of Isopar H. By the addition of 1% w/v soya bean lecithin the conductivity was raised from $1.1 \times 10^4$ psm$^{-1}$ to $2 \times 10^5$ psm$^{-1}$.

EXAMPLE 2

30 parts by weight of a poly (vinyl butyral) resin (Butvar B98 manufactured by Monsanto) modified by reaction with 4-toluene sulphonyl isocyanate (acid value 70); 60 parts by weight of a diazo compound derived from the product obtained by reacting 4(N-ethyl-N-hydroxyethylamino) acetanilide and isophorone diisocyanate with 2-hydroxy-4-methoxybenzophenone-5-sulphonate as the anion in the manner described in EP-B-0 030 862; and 7.0 parts by weight of Waxoline Red O were dissolved in 3500 parts by weight of ethylene glycol monomethyl ether. The resultant solution was coated on to an electrochemically grained and anodised aluminium sheet and dried with warm air to form a radiation-sensitive plate. An electrostatic atomising apparatus (schematically shown in FIG. 6) comprising a metal blade was provided and the radiation sensitive plate was positioned so that its radiation sensitive layer was beneath the blade. A potential of $-15$ kV (with respect to the aluminium sheet) was applied to the blade and a thin film of Dispersion B was passed over the blade. The flow rate was 0.125 cm$^3$/min per cm of blade and the ambient temperature was 35° C. Ligaments were formed along the blade edge.

On examination, the treated plate had a well adhered discontinuous covering layer which resulted in an improved drawdown time compared to an untreated plate.

DISPERSION B

An emulsifying agent/dispersion stabiliser was prepared by pumping the following materials into a stream of refluxing heptane.

| | |
|---|---|
| 140 g | lauryl methacrylate |
| 6 g | glycidyl methacrylate |
| 3 g | AZBN |
| 20 g | ethyl acetate |

After the final addition, the solution was heated for a further three hours, after which time the ethyl acetate was removed by distillation.

A solution of 54 g of 0,0-bis(2-amino propyl) polyethylene glycol 800 (supplied by Texaco) in 100 ml of n-butanol was added all at once and the mixture was refluxed for four hours. A clear 42% solids solution of the emulsifying agent/dispersing agent was obtained.

20 ml of the above solution was added to 172 g of a 30% w/w solution of Mowilith CT5 (a copolymer of vinyl acetate and crotonic acid from Hoechst) in methanol. 200 ml of Isopar J was then added to the mixture. A fine droplet size emulsion of the methanol solution in Isopar was obtained after passing the mixture through an ultrasonic homogeniser operating at 1000 psi (Lucas Dawe Ultrasonics). The methanol was removed by distillation to give a fine dispersion of Mowilith CT5 in Isopar J.

EXAMPLE 3

A radiation sensitive plate was prepared by coating an aluminium substrate with a radiation sensitive composition comprising a naphthoquinone diazide ester with a cresol novolak resin.

Dispersion A, whose preparation is described in Example 1 was sprayed onto the surface of the plate using an air assisted electrostatic spray gun of the type shown in FIG. 1. Spraying was conducted at an ambient temperature of 35° C. using a liquid feed rate of 8 cc/min, an atomising pressure of 25 psi, and a voltage of $-35$ kV.

On examination the treated plate showed itself to have a well adhered discontinuous covering layer which gave rise to an improved drawdown time compared to an untreated plate.

EXAMPLE 4

The process of Example 2 was repeated but using alternatives to Mowilith CT5 in the preparation of the dispersion for spraying (Dispersion B). In one case a styrene maleic acid copolymer partial ester of molecular weight 1700 and M.pt 160°-170° C. (SMA 17352 of Arco Chemical Company) was used. In another case a carboxyl functional acrylate copolymer of M.wt 40,000 and glass transition temperature of 50° C. (Carboset XL27 of B.F. Goodrich) was used. In each case the sprayed plate exhibited an improvement in the rate of drawdown when placed in a vacuum frame compared to an untreated plate.

We claim:

1. A method of producing a radiation sensitive device which comprises
   (i) providing a substrate carrying a radiation sensitive layer,
   (ii) providing a liquid composition comprising a liquid hydrocarbon and a material which is soluble or dispersible in developer for the radiation sensitive layer, and
   (iii) directing said composition towards the radiation sensitive layer by a spraying technique to form a discontinuous covering layer of the material on the surface of the radiation sensitive layer.

2. A method according to of claim 1, wherein the hydrocarbon is an aliphatic hydrocarbon.

3. A method according to claim 1 wherein the hydrocarbon has a boiling point of from 150° to 200° C.

4. A method according to claim 1 wherein the composition has a conductivity of from $10^3$ to $10^9$ psm$^{-1}$.

5. A method according to claim 4, wherein the spraying technique includes the step of providing a potential in the composition of at least 5 kV relative to the substrate to cause the composition to form drops in the absence of any other disruptive forces.

6. A method according to claim 1 wherein the spraying technique is an electrostatic spray technique.

7. A method according to claim 6, wherein the spraying technique is an electrostatic rotary bell atomising technique.

8. A method according to claim 1 wherein the chemical structure of the material of the discontinuous layer includes at least one moiety selected from the group consisting of —OH, —COOH, —SO$_3$H, —PO$_3$H, —SO$_2$NH— moieties and their corresponding anions.

9. A method according to claim 1 wherein the material of the discontinuous covering layer is a copolymer formed of a component selected from the group consisting of acrylic acid, methacrylic acid, crotonic acid, itaconic acid, maleic acid, fumaric acid and mixtures thereof and a component selected from the group consisting of styrene, vinyl toluene, ethylene, propylene, vinyl acetate, methyl methacrylate, butyl methacrylate, ethyl acrylate, acrylonitrile and mixtures thereof.

10. A method according to claim 9, wherein the material of the discontinuous covering layer is selected from the group consisting of vinyl acetate/crotonic acid copolymers and methacrylic acid/methacrylic acid ester copolymers.

* * * * *